(12) United States Patent  
Baek et al.

(10) Patent No.: US 8,027,009 B2  
(45) Date of Patent: Sep. 27, 2011

(54) LIQUID CRYSTAL DISPLAY DEVICE AND METHOD OF MANUFACTURING THE SAME

(75) Inventors: Myoung Kee Baek, Yongin-si (KR); Kwang Ho Jang, Seoul (KR)

(73) Assignee: LG Display Co., Ltd., Seoul (KR)

( * ) Notice: Subject to any disclaimer, the term of this patent is extended or adjusted under 35 U.S.C. 154(b) by 346 days.

(21) Appl. No.: 12/329,983

(22) Filed: Dec. 8, 2008

(65) Prior Publication Data

US 2009/0279011 A1      Nov. 12, 2009

(30) Foreign Application Priority Data

May 28, 2008   (KR) .................. 10-2008-0049654

(51) Int. Cl.
 *G02F 1/1345*  (2006.01)
 *G02F 1/1343*  (2006.01)
 *G02F 1/1339*  (2006.01)

(52) U.S. Cl. ......... 349/151; 349/139; 349/152; 349/155

(58) Field of Classification Search .................. None
See application file for complete search history.

(56) References Cited

U.S. PATENT DOCUMENTS

| | | | |
|---|---|---|---|
| 7,564,512 B2 * | 7/2009 | Yamazaki et al. | 349/43 |
| 2002/0191140 A1 * | 12/2002 | Eguchi et al. | 349/149 |
| 2005/0194657 A1 * | 9/2005 | Koide | 257/499 |

* cited by examiner

*Primary Examiner* — Rhonda Peace

(74) *Attorney, Agent, or Firm* — Brinks Hofer Gilson & Lione

(57) ABSTRACT

A liquid crystal display device and a method of manufacturing the same are disclosed. The liquid crystal display device includes a liquid crystal panel including gate pads connected to gate lines and data pads connected to data lines; at least one driving circuit mounted on a circuit substrate including poly-silicon thin-film transistors, formed by a low temperature poly-silicon (LTPS) process, and including circuit pads to be connected to the gate pads or data pads; and a conductive film to electrically connect the driving circuit and the gate pads or data pads.

9 Claims, 9 Drawing Sheets

LIQUID CRYSTAL DISPLAY DEVICE AND METHOD OF MANUFACTURING THE SAME

RELATED APPLICATIONS

This application claims the benefit of Korean Patent Application No. P2008-049654, filed on May 8, 2008, which is hereby incorporated by reference as if fully set forth herein.

BACKGROUND

1. Field of the Disclosure

The present disclosure relates to a liquid crystal display device, and more particularly, to a liquid crystal display device and a method of manufacturing the same that can simplify a manufacturing process and can reduce manufacturing costs.

2. Discussion of the Related Art

With the progress of an information-dependent society, the demand for various display devices has increased. To meet such a demand, efforts have recently been made to research flat panel display devices such as liquid crystal display (LCD) devices, plasma display panels (PDPs), electro luminescent display (ELD) devices, vacuum fluorescent display (VFD) devices, and the like. Some types of such flat panel display devices are being practically applied to various appliances for display purposes.

In particular, LCDs have been used as a substitute for cathode ray tubes (CRTs) in association with mobile image display devices because LCDs have advantages of superior picture quality, low weight, thinness, and low power consumption. Thus, LCDs are currently most widely used. Various applications of LCDs are being developed in association with not only mobile image display devices such as monitors of laptop computers, but also monitors of TVs to receive and display broadcasting signals, and monitors of computers.

Such an LCD device mainly includes a liquid crystal panel in which liquid crystal cells are arranged in a matrix shape, and driving integrated circuits for driving the liquid crystal cells. The liquid crystal panel includes a first substrate formed with a thin film transistor array and a second substrate formed with a color filter array. The first substrate and the second substrate are joined together in such a manner that a liquid crystal layer is interposed therebetween through a cell process.

The first substrate serves as a thin-film transistor substrate, and includes a plurality of gate lines, a plurality of data lines intersecting with the gate lines while interposing a gate insulating layer between the gate lines and the data lines to define pixel regions, thin film transistors formed at the respective intersections of the gate lines and the data lines, and pixel electrodes formed in the respective pixel regions to be connected to the respective thin film transistors.

The second substrate serves as a color filter substrate, and includes a black matrix layer for blocking incidence of light to a region other than the pixel regions, R, G, B color filter layers for reproducing color tones, and a common electrode on the color filter layers.

The thin-film transistor substrate and the color filter substrate are joined together while interposing a liquid crystal layer therebetween.

The driving integrated circuit includes a plurality of data driving integrated circuits for applying image signals to the data lines of the liquid crystal panel, and a plurality of gate driving integrated circuits for applying gate pulses to the gate lines of the liquid crystal panel. The gate driving integrated circuits and the data driving integrated circuits are mounted to be connected to gate pads connected to the gate lines and data pads connected to the data lines, respectively. There are two mounting methods, one of which is a TAB method, and the other of which is a chip on glass (COG) method, by which chips are directly mounted on the substrates.

According to the TAB method, the gate driving integrated circuits and the data driving integrated circuits respective are mounted on a tape carrier package (TCP), and are connected to a liquid crystal panel by using an ACF film. According to the chip on glass (COG) method, the gate driving integrated circuits and the data driving integrated circuits are directly mounted on a thin film transistor array substrate, and a flexible printed circuit film (FPC) is attached to transmit signals to the gate driving integrated circuits and the data driving integrated circuits.

However, the technology of mounting driving integrated circuits by using the TAB or COG method has a problem in that in the mounting of a TCP, an FPC and a PCB increases the costs and increases a bezel due to a large area occupied by the TCP, the FPC and the PCB.

BRIEF SUMMARY

A liquid crystal display device comprises: a liquid crystal panel including gate pads connected to gate lines and data pads connected to data lines; at least one driving circuit mounted on a circuit substrate including poly-silicon thin-film transistors, formed by a low temperature poly-silicon (LTPS) process, and including circuit pads to be connected to the gate pads or data pads; and a conductive film to electrically connect the driving circuit and the gate pads or data pads.

In accordance with another aspect, a method of manufacturing a liquid crystal display device comprises: preparing a liquid crystal panel including gate pads connected to gate lines and data pads connected to data lines; forming at least one driving circuit mounted on a circuit substrate including poly-silicon thin-film transistors, using a low temperature poly-silicon (LTPS) process, and including circuit pads to be connected to the gate pads or data pads; and electrically connecting the driving circuit and the gate pads or data pads through a conductive film.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE DRAWINGS AND THE PRESENTLY PREFERRED EMBODIMENTS

Reference will now be made in detail to the embodiments of the present invention associated with a liquid crystal display device and a method of manufacturing the same, examples of which are illustrated in the accompanying drawings. Wherever possible, the same reference numbers will be used throughout the drawings to refer to the same or like parts.

Figure 1:
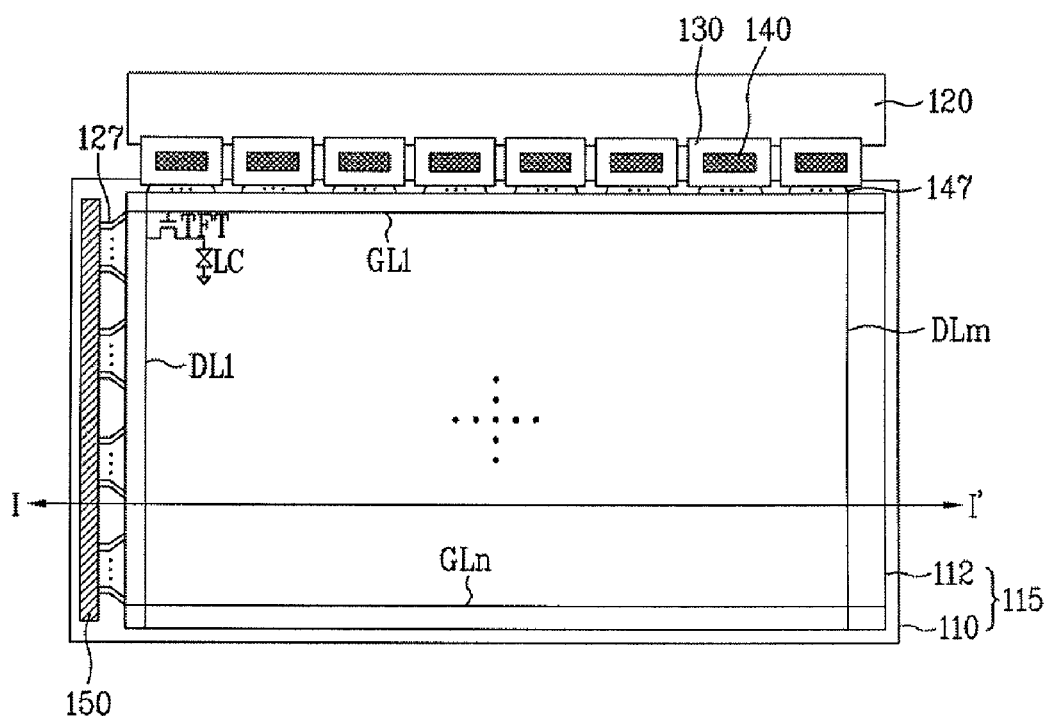
FIG. 1 is a top view illustrating a liquid crystal display device according to an embodiment of the present disclosure.
Figure 2:
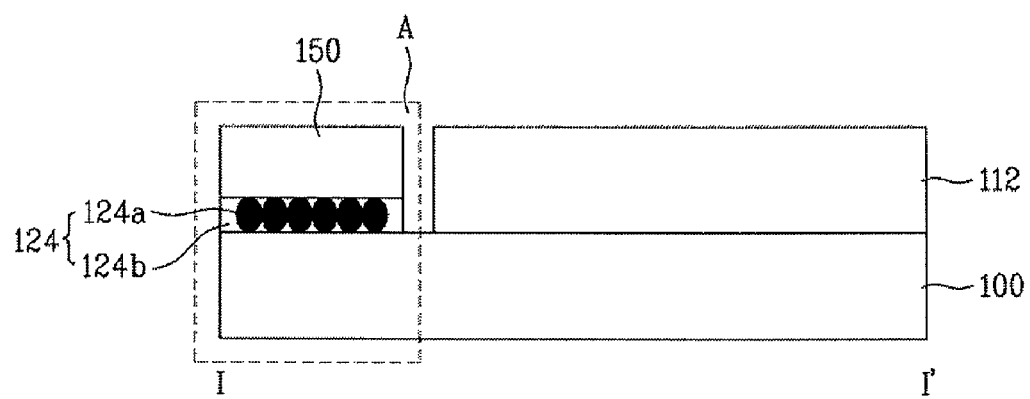
FIG. 2 is a cross-sectional view illustrating the liquid crystal display device, taken along line I-I' of FIG. 1.

FIG. 1 is a top view illustrating a liquid crystal display device according to the present disclosure, and FIG. 2 is a cross-sectional view illustrating the liquid crystal display device, taken along line I-I' of FIG. 1.

Referring to FIGS. 1 and 2, the liquid crystal display device includes a liquid crystal panel 115 in which liquid crystal cells LC are arranged in a matrix shape, and driving circuits for driving the liquid crystal cells LC. The liquid crystal panel 115 includes a first substrate 110 formed with a thin film transistor array and a second substrate 112 formed with a color filter array. The first substrate 110 and the second substrate 112 are joined together in such a manner that a liquid crystal layer is interposed therebetween through a cell process.

The first substrate 110 serves as a thin-film transistor substrate, and includes a plurality of gate lines GL1 to GLn, a plurality of data lines DL1 to DLm intersecting with the gate lines while interposing a gate insulating layer between the gate lines GL1 to GLn and the data lines DL1 to DLm to define pixel regions, thin film transistors TFT formed at the respective intersections of the gate lines GL1 to GLn and the data lines DL1 to DLm, and pixel electrodes formed in the respective pixel regions to be connected to the respective thin film transistors TFT.

Each thin film transistor TFT includes a gate electrode branched from each gate line GL, a gate insulating layer formed on a front surface of a substrate formed with the gate electrode, a semiconductor layer formed on the gate insulating layer while overlapping with the gate electrode, a source electrode branched from each data line DL and formed on the semiconductor layer, and a drain electrode formed on the semiconductor layer while opposing the source electrode.

The first substrate 110 is joined with the second substrate 112 serving as a color filter substrate while interposing the liquid crystal layer between the first and second substrates 110 and 112. The second substrate 112 includes a black matrix layer for blocking incidence of light to a region other than the pixel regions, R, G, B color filter layers for reproducing color tones, and a common electrode on the color filter layers.

The driving circuits include a plurality of data driving integrated circuits 140 for applying image signals to the data lines DL to DLm of the liquid crystal panel 115 in a non-display region which is a region of the first substrate 110 exposed by the second substrate 112, and a gate driving circuit 150 for applying scan pulses to the gate lines GL to GLn of the liquid crystal panel 115.

The gate driving circuit 150 is formed by a low temperature poly silicon (LTPS) process, in which poly-silicon thin film transistors are mounted on a circuit substrate, and are mounted on the first substrate 110. The gate driving circuit 150 sequentially apply scan pulses to the gate lines GL1 to GLn through a plurality of gate links 127, and sequentially drive the liquid crystal cells LC on the liquid crystal panel 115 one line by one line.

Whenever the scan pulse is applied to any one of the gate lines GL to GLn, the data driving integrated circuits 140 apply a pixel voltage signal to each of the data lines DL1 to DLm.

Gate pads connected to the gate lines are connected to the gate driving circuit 150 through an ACF film 124. The ACF film 124 includes conductive balls 124a and a thermosetting resin 124b, and is thermally pressed to electrically connect the gate pads and the gate driving integrated circuit 150.

The data driving integrated circuits 140 are mounted on a plurality of tape carrier packages (hereinafter, referred to as "TCPs") 130, respectively, and are disposed between a printed circuit board (PCB) 120 and the liquid crystal panel 115 to connect them. The data driving integrated circuits 140 convert digital data signals into analog image signals according to data control signals, and apply the image signals to the data lines DL1 to DLm through a plurality of data links 147, respectively.

Figure 3A:
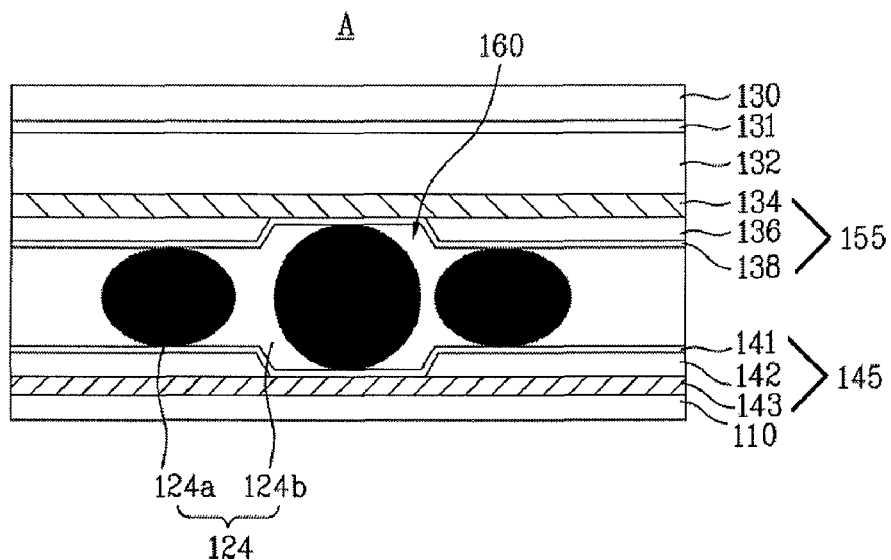
FIG. 3A is an enlarged cross-sectional view of an "A" portion of FIG. 2 according to a first embodiment.
Figure 3B:
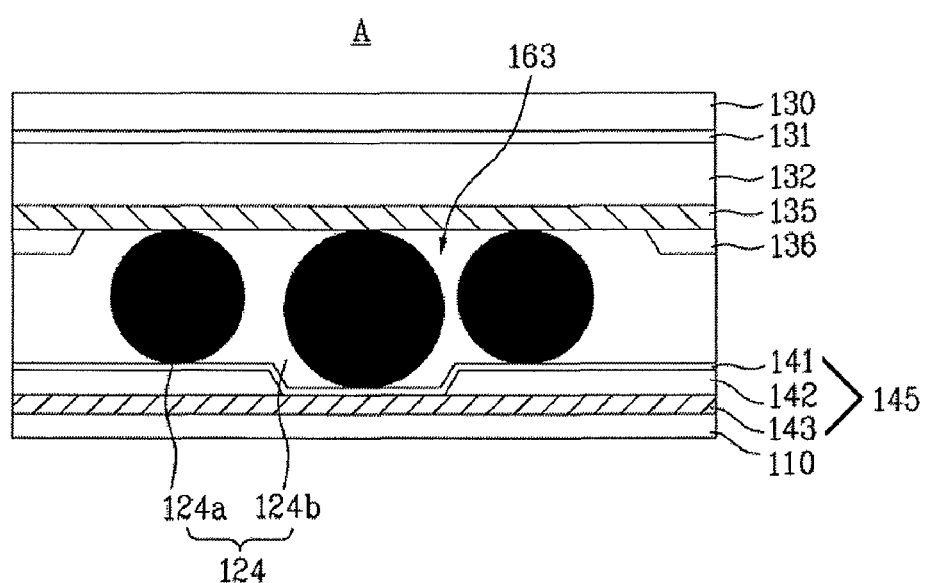
FIG. 3B is an enlarged cross-sectional view of an "A" portion of FIG. 2 according to a second embodiment.

FIG. 3A is an enlarged cross-sectional view of an "A" portion of FIG. 2 according to a first embodiment of the present invention, and FIG. 3B is an enlarged cross-sectional view of an "A" portion of FIG. 2 according to a second embodiment.

As shown in FIG. 3A, A circuit pad 155 of the gate driving circuit 150 and the gate pad 145 of the liquid crystal panel 115 are connected to each other through the ACF film 124 which includes the conductive balls 124a, each having a diameter of 1 to 15 μm, and the thermosetting resin 124b.

A pad region of the gate driving circuit 150 includes a buffer layer 131, a gate insulating layer (not shown), an interlayer insulating layer 132, a lower pad 134, a protective layer 136 and an upper pad 138 sequentially deposited on the circuit substrate 130. The circuit pad 155 comprises the lower and upper pads 134 and 138.

The buffer layer 131 serves to prevent impurities generated from the circuit substrate 130 from moving to a semiconductor layer (not shown) of the poly-silicon thin film transistors (not shown) in the gate driving circuit 150.

The protective layer 136 includes a contact hole 160 for exposing the lower pad 134. The upper pad 138 and the lower pad 134 are electrically connected to each other through the contact hole 160. The lower pad 134 is formed in a gate metal layer or a source/drain metal layer. The upper pad 138 is formed in a transparent conductive layer.

The gate pad 145 includes an upper pad 141 and a lower pad 143 disposed on the first substrate 110. The lower pad 143 and the upper pad 141 are electrically connected to each other through a contact hole formed at a protective layer 142. The lower pad 143 is formed in the source/drain metal layer or the gate metal layer. The upper pad 141 is formed in the transparent conductive layer.

The gate metal layer is made of a metal selected from the group consisting of molybdenum (Mo), aluminum (Al), aluminum-neodymium (Al—Nd), copper (Cu), chromium (Cr), titanium (Ti) and alloys thereof, and has a single-layered structure or a multi-layered structure.

The source/drain metal layer is made of a metal selected from the group consisting of molybdenum (Mo), aluminum (Al), aluminum-neodymium (Al—Nd), copper (Cu), chromium (Cr), titanium (Ti), molybdenum titanium (MoTi) alloy, molybdenum niobium (MoNb) alloy, titanium niobium (TiNb) alloy and alloys thereof, and has a single-layered structure or a multi-layered structure.

The buffer layer 131, the gate insulating layer (not shown), the inter-layer insulating layer 132, the protective layer 136 of the gate driving circuit 150 and the protective layer 142 on the first substrate 110 are formed by depositing an inorganic insulating material, such as silicon oxide (SiOx) or silicon nitride (SiNx), using a PECVD method, or by coating acrylic organic compound having a small dielectric constant or an organic insulating material, such as benzocyclobuten (BCB) or perfluorocyclobutane (PFCB), using a spin or spinless coating method.

The transparent conductive layer is made of a material selected from the group consisting of indium tin oxide (ITO), tin oxide (TO), indium zinc oxide (IZO) and indium tin zinc oxide (ITZO).

The gate driving circuit 150 and the gate pad 145 are thermally pressed and connected to each other by means of the ACF film 124, and the upper pad 138 of the gate driving integrated circuit 150 and the upper pad 141 of the gate pad 145 are electrically connected to each other through the ACF film 124. The pressing process is carried out in such a manner that the gate driving circuit 150 formed by an LTPS process and the gate pad 145 of the liquid crystal panel 115 are aligned with each other and preliminarily pressed by using a TAB bonding machine, and then are finally pressed by using a PCB bonding machine.

The preliminary pressing process is carried out under the conditions of a temperature of about 0 to about 500° C., a pressure of about 0 to about 0.60 MPa and time of about 0 to about 30 sec. The final pressing process is carried out under the conditions of a temperature of about 100 to about 500° C., a pressure of about 0.15 to about 0.60 MPa and time of about 2 to about 60 sec. Such a pressure condition is a pressure condition in the bonding machine, however a practical pressure condition may be changed.

Besides the above-described pressing method, the gate driving circuit 150 and the gate pad 145 may be pressed by a single pressing process using a bonding machine.

The gate driving circuit 150 and the gate pad 145 may also be formed as shown in FIG. 3B.

Referring to FIG. 3B, A pad region of the gate driving circuit 150 includes the buffer layer 131, the gate insulating layer (not shown), the inter-layer insulating layer 132 and the circuit pad 135 sequentially deposited on the circuit substrate 130.

The protective layer 136 has contact hole 163 to expose the pad 135. In order to prevent a corrosion problem of the circuit pad 135, the circuit pad 135 is made of a material selected from the group consisting of molybdenum (Mo), chromium (Cr), tungsten (W), titanium (Ti), molybdenum-titanium (MoTi) and mixture thereof, which have a superior anti-corrosion property.

The gate pad 145 includes the upper pad 141 and the lower pad 143 disposed on the first substrate 110. The lower pad 143 and the upper pad 141 are electrically connected to each other through contact hole. The lower pad 143 is formed in a source/drain metal layer or a gate metal layer. The upper pad 141 is formed in a transparent conductive layer.

The gate metal layer is made of a metal selected from the group consisting of molybdenum (Mo), aluminum (Al), aluminum-neodymium (Al—Nd), copper (Cu), chromium (Cr), titanium (Ti) and alloys thereof, and has a single-layered structure or a multi-layered structure.

The source/drain metal layer is made of a metal selected from the group consisting of molybdenum (Mo), aluminum (Al), aluminum-neodymium (Al—Nd), copper (Cu), chromium (Cr), titanium (Ti), molybdenum titanium (MoTi) alloy, molybdenum niobium (MoNb) alloy, titanium niobium (TiNb) alloy and alloys thereof, and has a single-layered structure or a multi-layered structure.

The buffer layer 131, the gate insulating layer (not shown), the inter-layer insulating layer 132, the protective layer 136 of the gate driving integrated circuit 150 and the protective layer 142 on the first substrate 110 are formed by depositing an inorganic insulating material, such as silicon oxide (SiOx) or silicon nitride (SiNx), using a PECVD method, or by coating acrylic organic compound having a small dielectric constant or an organic insulating material, such as benzocyclobuten (BCB) or perfluorocyclobutane (PFCB), using a spin or spinless coating method.

The transparent conductive layer is made of a material selected from the group consisting of indium tin oxide (ITO), tin oxide (TO), indium zinc oxide (IZO) and indium tin zinc oxide (ITZO).

The gate driving circuit 150 and the gate pad 145 are thermally pressed and connected to each other by means of the ACF film 124, and the circuit pad 135 of the gate driving circuit 150 and the upper pad 141 of the gate pad 145 are electrically connected to each other through the ACF film 124.

The pressing process is carried out in such a manner that the gate driving circuit 150 formed by an LTPS process and the gate pad 145 of the liquid crystal panel 115 are aligned with each other and preliminarily pressed by using a TAB bonding machine, and then are finally pressed by using a PCB bonding machine.

The preliminary pressing process is carried out under the conditions of a temperature of 0 to 500° C., a pressure of 0 to 0.60 MPa and time of 0 to 30 sec. The final pressing process is carried out under the conditions of a temperature of about 100 to about 500° C., a pressure of about 0.15 to about 0.60 MPa and time of about 2 to about 60 sec. Such a pressure condition is a pressure condition in the bonding machine, however a practical pressure condition may be changed.

Besides the above-described pressing method, the gate driving circuit 150 and the gate pad 145 may be pressed by a single pressing process using a bonding machine.

Because the gate driving circuit 150 formed by an LTPS process and the gate pad 145 are electrically connected to each other through the ACF film 124, a TCP, an FPC and a PCB in a TAB or COG method are not used in the present invention. Accordingly, a manufacturing process is simplified, and manufacturing costs are reduced. Further, because an area, which might be occupied by a TCP, an FPC and a PCB, is decreased, the requirement of a narrow bezel can be met.

FIGS. 4A to 4D are cross-sectional views illustrating a method of manufacturing the gate driving circuit 150 of FIG. 3A according to the first embodiment of the present invention.

Figure 4A:
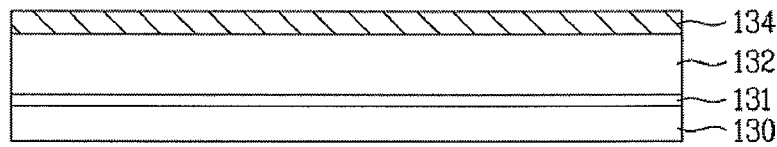
FIGS. 4A to 4D are cross-sectional views illustrating a method of manufacturing a gate driving circuit of FIG. 3A according to the first embodiment.
Figure 4B:
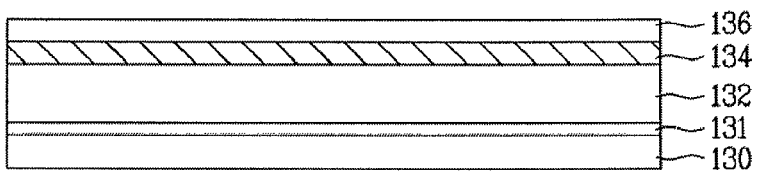

Referring to FIGS. 4A and 4B, the buffer layer 131, the gate insulating layer (not shown), the inter-layer insulating layer 132, the lower pad 134 and the protective layer 136 are sequentially deposited on the circuit substrate 130.

The buffer layer 131, the gate insulating layer (not shown), the inter-layer insulating layer 132 and the protective layer 136 are formed by depositing an inorganic insulating material, such as silicon oxide (SiOx) or silicon nitride (SiNx), using a PECVD method, or by coating acrylic organic compound having a small dielectric constant or an organic insulating material, such as benzocyclobuten (BCB) or perfluorocyclobutane (PFCB), using a spin or spinless coating method.

The lower pad 134 is formed by deposition, e.g., sputtering, of a gate metal layer material or a source/drain metal layer material on the inter-layer insulating layer 132.

The gate metal layer is made of a metal selected from the group consisting of molybdenum (Mo), aluminum (Al), aluminum-neodymium (Al—Nd), copper (Cu), chromium (Cr), titanium (Ti) and alloys thereof, and has a single-layered structure or a multi-layered structure.

The source/drain metal layer is made of a metal selected from the group consisting of molybdenum (Mo), aluminum (Al), aluminum-neodymium (Al—Nd), copper (Cu), chromium (Cr), titanium (Ti), molybdenum titanium (MoTi) alloy, molybdenum niobium (MoNb) alloy, titanium niobium (TiNb) alloy and alloys thereof, and has a single-layered structure or a multi-layered structure.

Figure 4C:
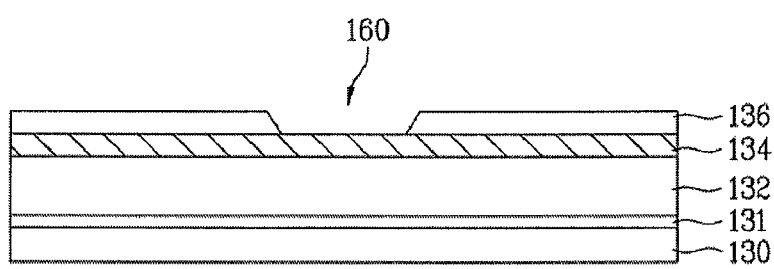
Figure 4D:
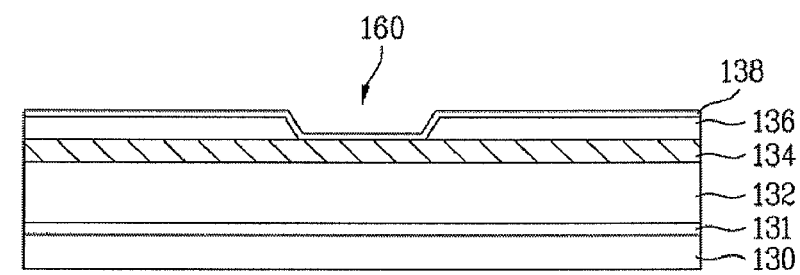

Subsequently, as shown in FIG. 4C, the contact hole 160 is formed at the protective layer 136 through a photolithography process and an etching process using a mask, so that a partial region of the lower pad 134 is exposed. Thereafter, as shown in FIG. 4D, the upper pad 138 of a transparent conductive layer is formed on the protective layer 136. The upper pad 138 is electrically connected to the lower pad 134 through the contact hole 160.

Figure 5A:
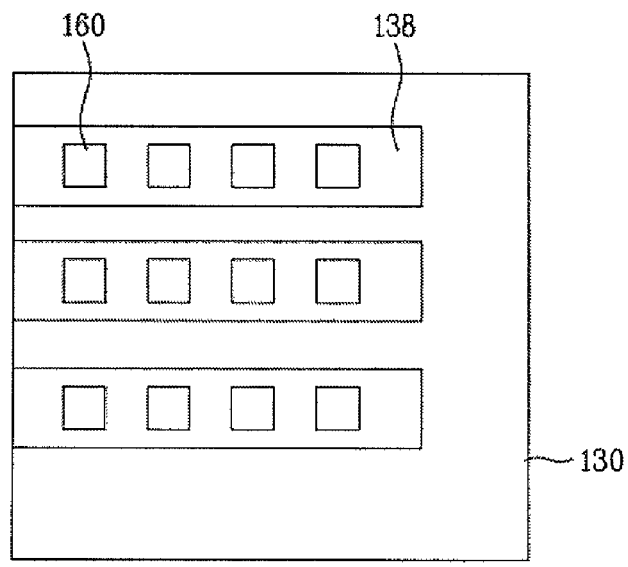
FIGS. 5A to 5C are views illustrating embodiments of contact holes of the gate driving circuit.
Figure 5B:
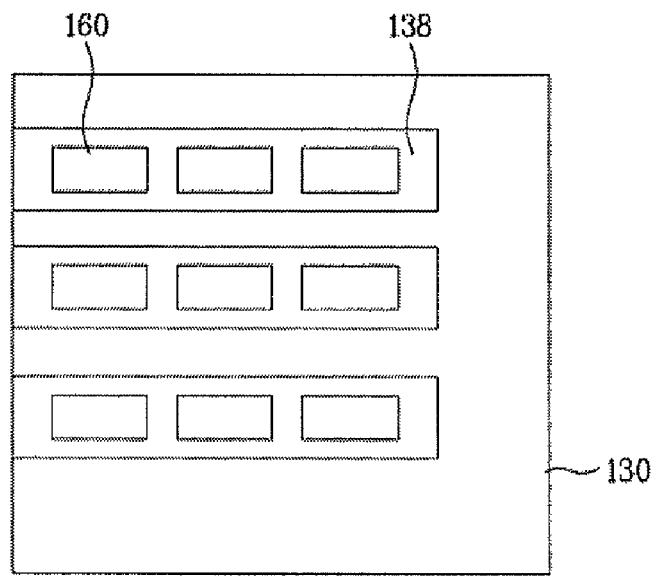
Figure 5C:
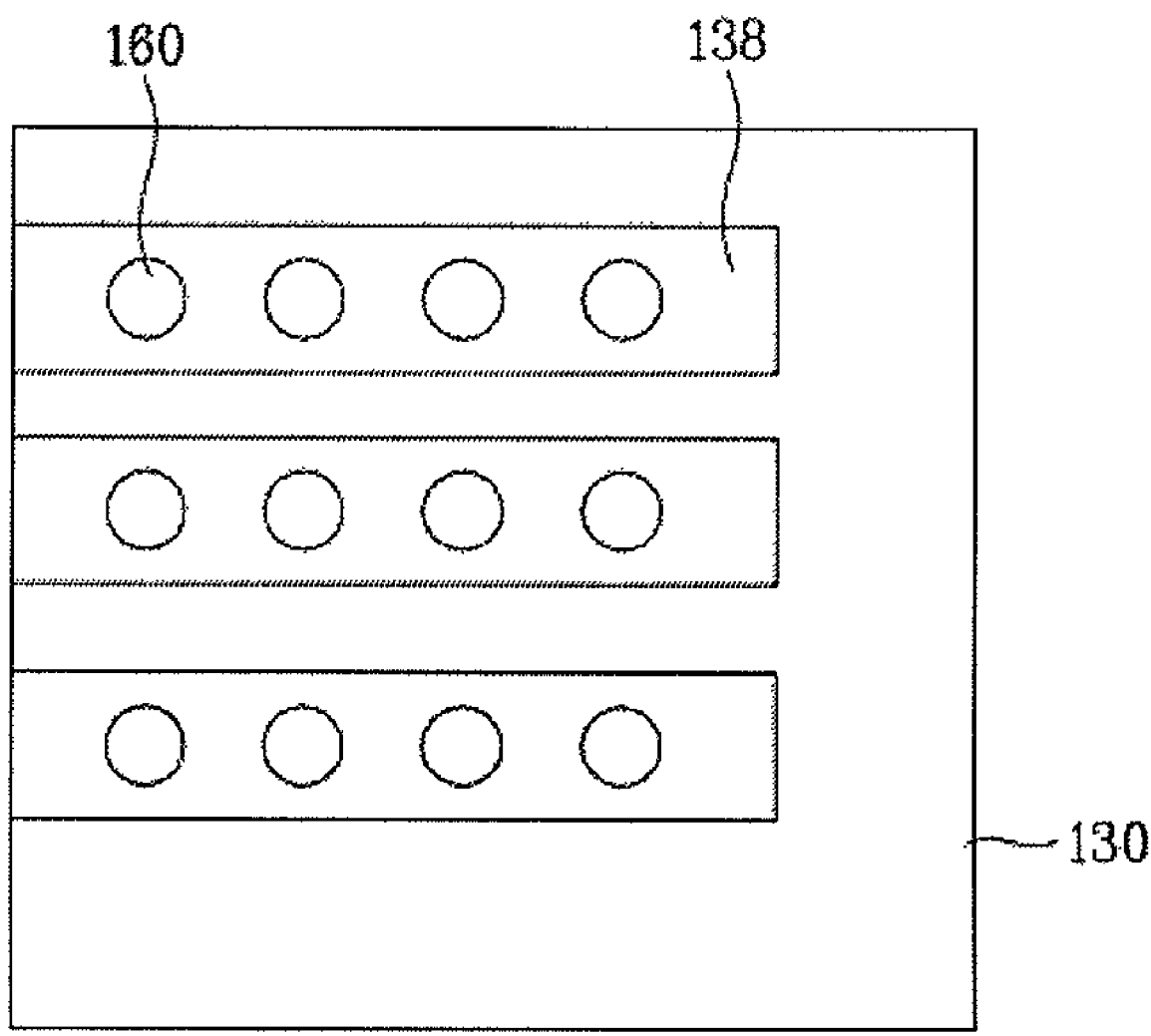

As shown in FIGS. 5A to 5C, the number of the contact hole 160 of the gate driving circuit 150 may be one or more, and the shape thereof is any one of square, rectangular and circular shapes.

Figure 6A:
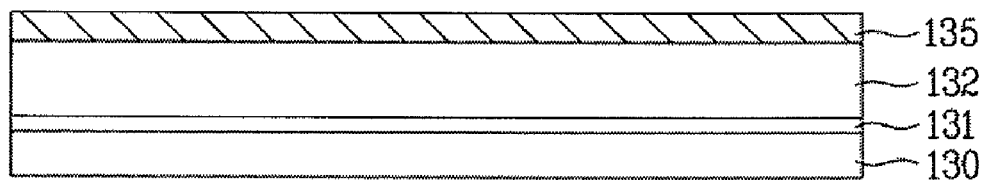
FIGS. 6A to 6C are cross-sectional views illustrating a method of manufacturing a gate driving circuit of FIG. 3B according to the second embodiment.
Figure 6B:
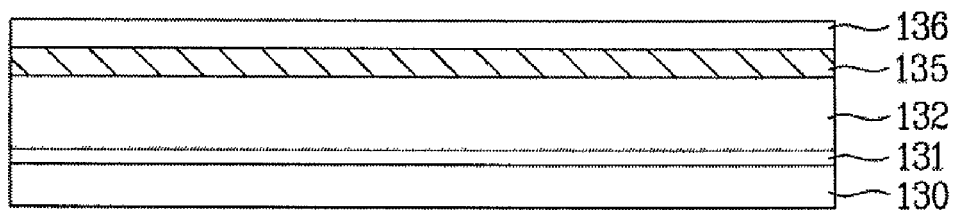
Figure 6C:
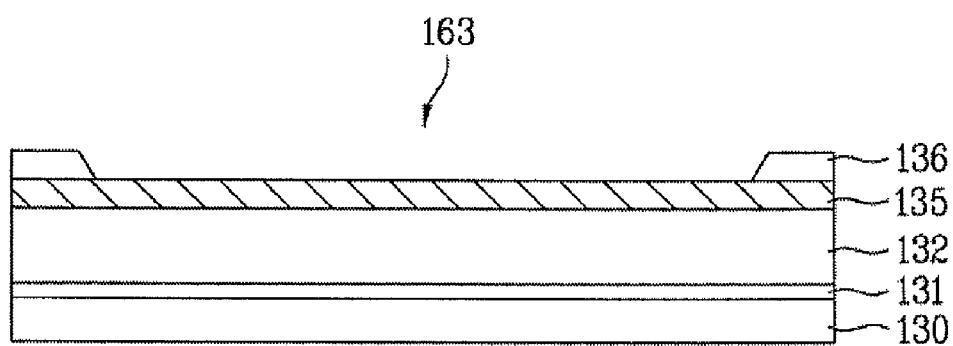

FIGS. 6A to 6C are cross-sectional views illustrating a method of manufacturing the gate driving integrated circuit 150 of FIG. 3B according to the second embodiment of the present invention.

Referring to FIGS. 6A and 6B, the buffer layer 131, the gate insulating layer (not shown), the inter-layer insulating layer 132, the circuit pad 135 and the protective layer 136 are sequentially deposited on the circuit substrate 130.

The buffer layer 131, the gate insulating layer (not shown), the inter-layer insulating layer 132 and the protective layer 136 are formed by depositing an inorganic insulating material, such as silicon oxide (SiOx) or silicon nitride (SiNx), using a PECVD method, or by coating acrylic organic compound having a small dielectric constant or an organic insulating material, such as benzocyclobuten (BCB) or perfluorocyclobutane (PFCB), using a spin or spinless coating method.

The circuit pad 135 on the inter-layer insulating layer 132 is formed through deposition, e.g., sputtering, of a material selected from the group consisting of molybdenum (Mo), chromium (Cr), tungsten (W), titanium (Ti), molybdenum-titanium (MoTi) and mixture thereof, which have a superior anti-corrosion property.

Subsequently, as shown in FIG. 6C, the contact hole 163 is formed at the protective layer 136 through a photolithography process and an etching process using a mask, so that a partial region of the circuit pad 135 is exposed.

Figure 7:
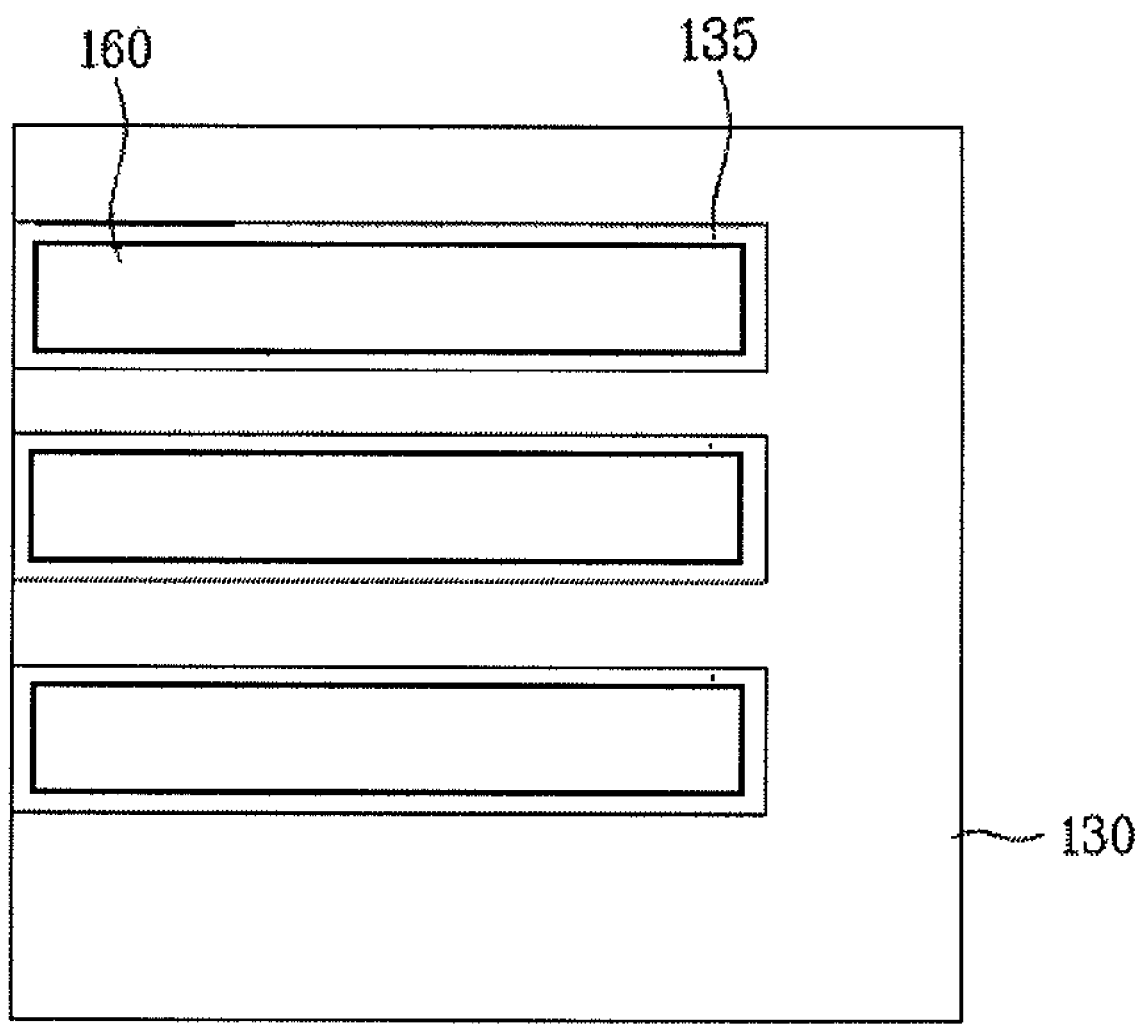
FIG. 7 is a top view illustrating contact holes of the circuit shown in FIG. 3B.

As shown in FIG. 7, the contact hole 163 of this embodiment has a contact hole area (i.e., a contact area) larger than the contact hole 160 of the first embodiment (refer to FIG. 3A).

Figure 8A:
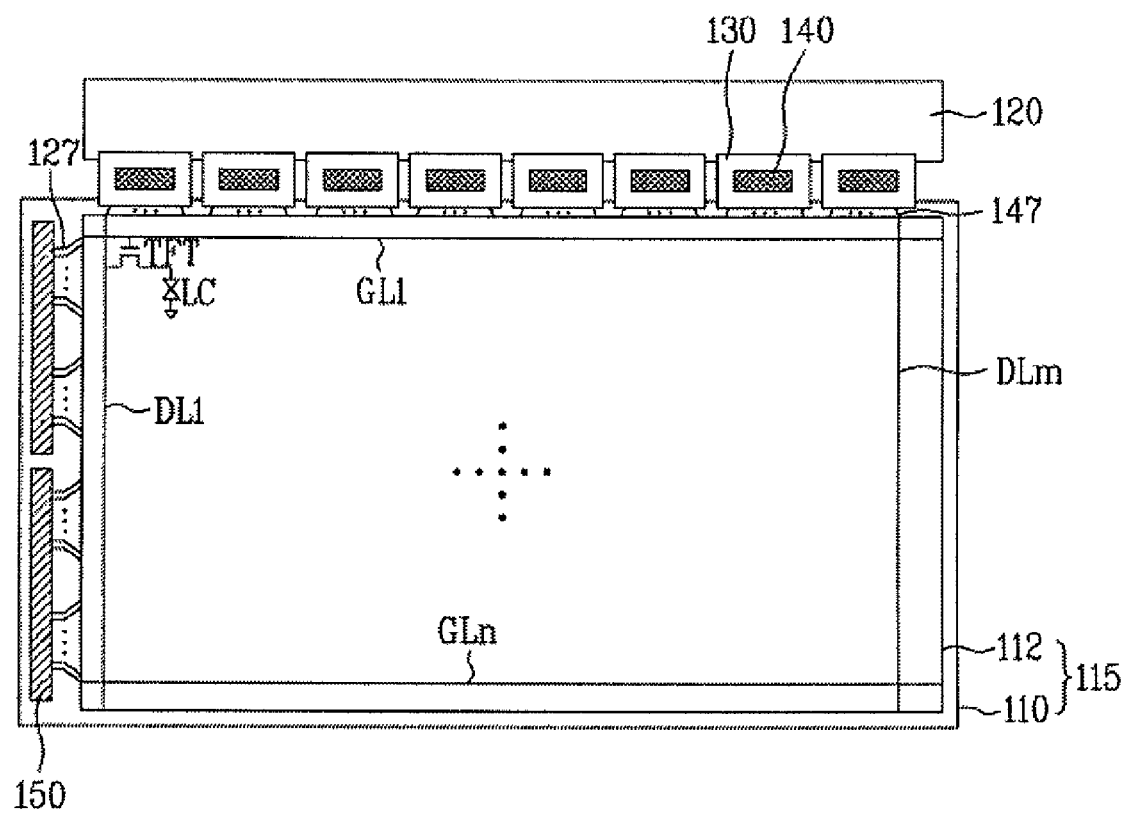
FIGS. 8A and 8B are views illustrating various modified examples of mounting a gate driving circuit formed by an LTPS process to a liquid crystal panel.
Figure 8B:
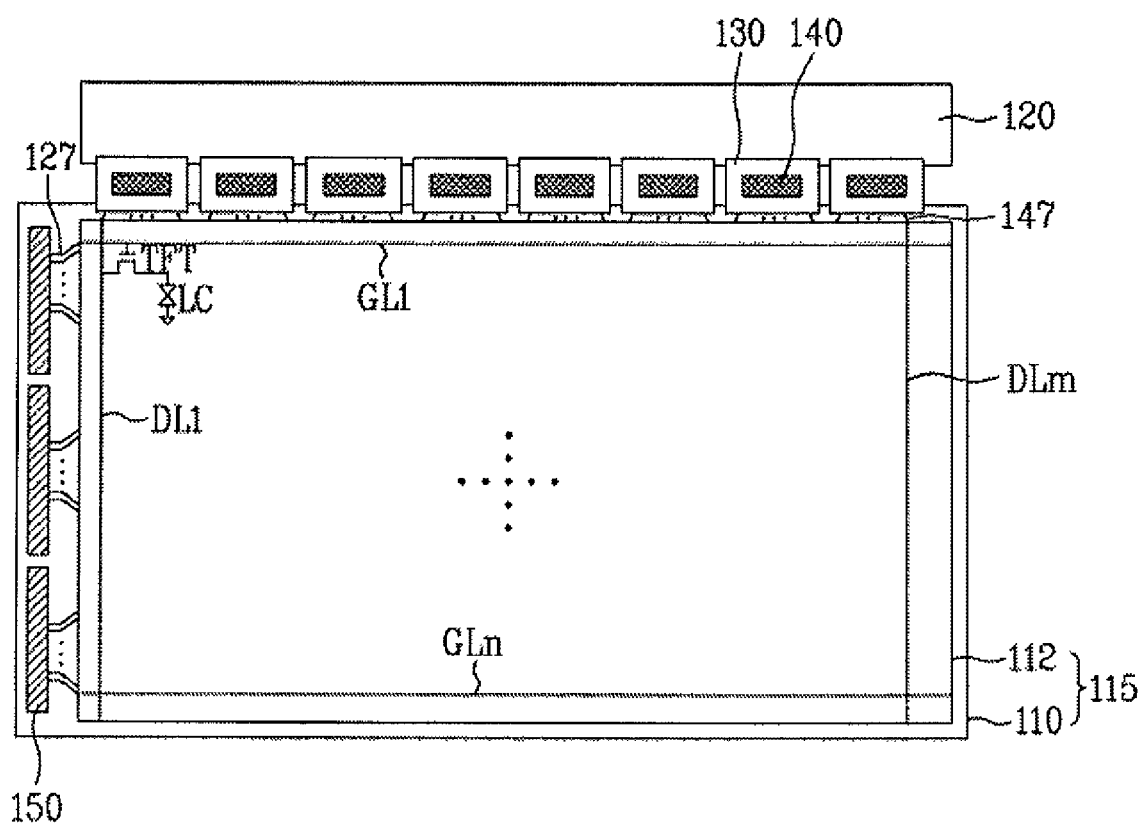

As shown in FIGS. 8A and 8B, the gate driving circuit 150 formed by an LTPS process may be provided in plural numbers to be mounted on the first substrate 110, as needed.

Because the gate driving circuit 150 formed by an LTPS process has a thickness of 2 to 7 mm, if a single gate driving circuit is formed too long, it has problems such that it is easily broken and an alignment or bonding process becomes difficult. Thus, as needed, the gate driving circuit 150 is divided.

As described above, because the gate driving circuit 150 formed by an LTPS process and the gate pad 145 are electrically connected to each other through the ACF film 124, a TCP, an FPC and a PCB in a TAB or COG method are not used in the present invention. Accordingly, a manufacturing process is simplified, and manufacturing costs are reduced. Further, because an area, which might be occupied by a TCP, an FPC and a PCB, is decreased, the requirement of a narrow bezel can be met.

Although the present invention has been explained with reference to the method of manufacturing the gate driving circuit, the present invention can also be applied to a method of manufacturing the data driving integrated circuit.

The liquid crystal display device and the method of manufacturing the same according to the present invention, as described above, have the following effects.

Because the gate driving circuit formed by an LTPS process and the gate pad are electrically connected to each other through the ACF film, a TCP, an FPC and a PCB in a TAB or COG method are not used in the present invention. Accordingly, a manufacturing process is simplified, and manufacturing costs are reduced. Further, because an area, which might be occupied by a TCP, an FPC and a PCB, is decreased, the requirement of a narrow bezel can be met.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. A liquid crystal display device comprising:
   a liquid crystal panel including gate pads connected to gate lines and data pads connected to data lines;
   at least one driving circuit mounted on a circuit substrate including poly-silicon thin-film transistors, formed by a low temperature poly-silicon (LTPS) process, and including circuit pads to be connected to the gate pads or data pads;
   a conductive film including conductive balls that electrically connect the driving circuit and the gate pads or data pads; and
   wherein each circuit pad of the driving circuit includes a lower pad, a protective layer having a plurality of contact holes to expose the lower pad; and
   wherein gate pads or data pads includes a lower pad, a protective layer having a contact hole to expose the lower pad and an upper pad connected to the lower pad through the contact hole and be formed in the contact hole and covered the protective layer.

2. The liquid crystal display device according to claim 1, wherein each circuit pad of the driving circuit further includes an upper pad connected to the lower pad through the contact hole.

3. The liquid crystal display device according to claim 2, wherein the contact hole is formed in one of square, rectangular and circular shapes.

4. The liquid crystal display device according to claim 1, wherein the driving circuit is divided into a plurality of driving circuits.

5. A method of manufacturing a liquid crystal display device, the method comprising:

preparing a liquid crystal panel including gate pads connected to gate lines and data pads connected to data lines;

forming at least one driving circuit mounted on a circuit substrate including poly-silicon thin-film transistors, using a low temperature poly-silicon (LTPS) process, and including circuit pads to be connected to the gate pads or data pads; and electrically connecting the driving circuit and the gate pads or data pads through a conductive film including conductive balls; and wherein each circuit pad of the driving circuit includes a lower pad, a protective layer having a plurality of contact holes to expose the lower pad; and wherein gate pads or data pads includes a lower pad, a protective layer having a contact hole to expose the lower pad and an upper pad connected to the lower pad through the contact hole and be formed in the contact hole and covered the protective layer.

6. The method according to claim 5, wherein each circuit pad of the driving circuit further includes an upper pad connected to the lower pad through the contact hole.

7. The method according to claim 6, wherein the contact hole is formed in one of square, rectangular and circular shapes.

8. The method according to claim 5, wherein the step of electrically connecting the driving circuit and the signal pad through the conductive film includes aligning and pressing the driving circuit and the signal pads by using a bonding machine.

9. The method according to claim 8, wherein the step of pressing is performed under conditions of a temperature of about 100 to about 500° C., a pressure of about 0.15 to about 0.60 MPa and time of about 2 to about 60 sec.

* * * * *